United States Patent [19]

Ida et al.

[11] 4,291,989
[45] Sep. 29, 1981

[54] ABNORMALITY SENSING DEVICE FOR GAS-INSULATED ELECTRIC APPARATUS

[75] Inventors: Yoshiaki Ida; Shiro Fukuda; Osayoshi Imamura, all of Amagasaki, Japan

[73] Assignee: Mitsubishi Denki Kabushiki Kaisha, Tokyo, Japan

[21] Appl. No.: 155,328

[22] Filed: Jun. 2, 1980

[51] Int. Cl.³ .......................................... G01N 21/17
[52] U.S. Cl. .................... 356/440; 356/435; 324/54; 340/630; 340/647
[58] Field of Search ............... 356/237, 239, 432, 434, 356/435, 437, 438, 439, 440; 324/54; 340/630, 635, 647

[56] References Cited

U.S. PATENT DOCUMENTS

| | | | |
|---|---|---|---|
| 2,374,762 | 5/1945 | McNitt | 340/635 |
| 2,427,013 | 9/1947 | McAdams | 356/435 |
| 3,027,552 | 3/1962 | Landis | 340/630 |
| 3,838,925 | 10/1974 | Marks | 356/435 |

*Primary Examiner*—R. A. Rosenberger
*Attorney, Agent, or Firm*—M. S. Yatsko

[57] ABSTRACT

An abnormality sensing device for use with gas-insulated equipment senses a faulted section by comparing a change in the quantity of light between a light emitting element and a light receiving element.

2 Claims, 3 Drawing Figures

ABNORMALITY SENSING DEVICE FOR GAS-INSULATED ELECTRIC APPARATUS

BACKGROUND OF THE INVENTION

This invention relates to an abnormality sensing device for gas insulated electric apparatus improved in insulating characteristics by charging an insulating gas in a hermetically sealed container in which the electric apparatus is accommodated.

It is well known that gas insulated substations excelling in both reliability and security have been developed because areas of installation of substations are sharply reduced, and in order to install substations in heavy industrial zones or coastal industrial zones where conventional air-insulated substations are undesirable due to dust or salt.

However, electric apparatus employed with said gas insulated substations have been composed of a multiplicity of gas sections separated by means of insulating spacers accommodated in hermetically sealed containers in connecting portions of the hermetically sealed containers. Faults resulting from discharge accidents of the electric apparatus occur in the interior of the hermetically sealed containers. In the past, it has been extremely difficult to locate fault sections through external observation and it has been required to disjoint the hermetically sealed containers and inspect the electric apparatus. It takes a long time for disjointing the hermetically sealed containers and inspecting the electric apparatus, interfering with the stable supply of electric power. Thus, it is desirable to provide a way for easily sensing a fault section.

SUMMARY OF THE INVENTION

The present invention has been made in order to improve said various problems of the prior art practice and aims at the provisions of an abnormality sensing device for a gas insulated electric apparatus capable of easily sensing a fault section by means of a change in quantity of light between a light emitting element and a light receiving element disposed in a hermetically sealed container.

BRIEF DESCRIPTION OF THE DRAWINGS

Reference is now made to the description of the preferred embodiment, illustrated in the accompanying drawings in which.

DESCRIPTION OF THE PREFERRED EMBODIMENT

Figure 1:
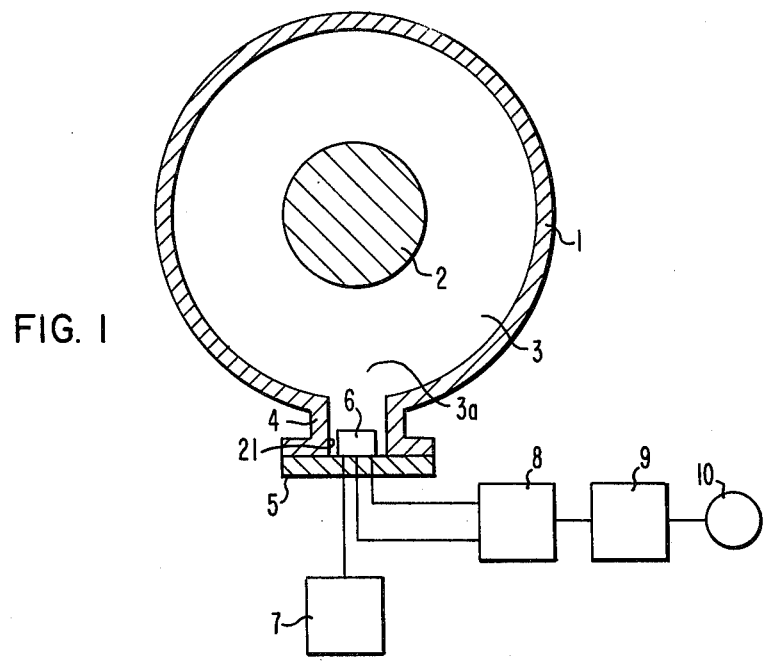
FIG. 1 is a partially sectional view of a gas-insulated apparatus utilizing the abnormality sensing device.
Figure 2:
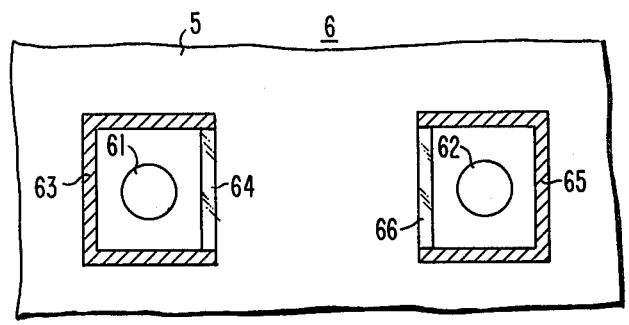
FIG. 2 is a detailed view of the sensing element.

Referring now more particularly to FIGS. 1 and 2, therein is illustrated an abnormality sensing device for a gas insulated electric apparatus according to one embodiment of the present invention. The electric apparatus 2 is accommodated in a container 1 and may be, for example, an electricity transmitting member which is applied with a high voltage. Said electricity transmitting member 2 is supported by an insulating spacer (not shown) disposed on the connection of the container 1 or the like, the container 1 being hermetically sealed with this insulating spacer. A flange 4 is disposed on the container 1 and includes the required opening 21. A cover 5 is mounted to the flange 4 and the interior of the container 1 is sealed by means of this cover 5. A sensing element 6, described hereinafter, is mounted to said cover 5 and is accommodated in the interior of the container 1. An electric source device 7 is used for supplying electric power to the sensing element 6, and a differential amplifier 8 is utilized for amplifying and outputting a sensed output difference from said sensing element 6. A signal processing device 9 is coupled to the output from said differential amplifier 8 and delivers an output signal when this input from the amplifier 8 exceeds a specified value. A display device 10 receives as an input the output signal from said signal processing device 9 and the display, such as lighting or an alarm, is effected with this input.

In FIG. 2, wherein the details of said sensing element 6 is shown, a light emitting element 61 and a light receiving element 62 are disposed oppositely to each other. A case 63 contains the light emitting element 61 and is composed of a light shading material. A transmitting member 62, such as transparent glass formed of a material capable of withstanding a minute amount of gaseous $SF_4$ is disposed on said case 63 and is arranged to be capable of transferring a quantity of light to the light receiving element 62. A second case 65, in which the light receiving element 62 is accommodated, has for one wall, the transmitting member 66.

The sensing element 6 is constructed as described above and an electric power from the electric source device 7 is supplied to the light emitting element 61 and the light receiving element 62. The elements 61, 62 are connected to the differential amplifier 8 which senses a difference between the quantity of light emitted by the light emitting element 61 and the quantity of light received by the light receiving element 62.

Next the description is made in conjunction with the operation of sensing an abnormality performed by said embodiment. If a discharge accident has occurred in the interior of the hermetically sealed container 1, one part of the metallic constituents of the hermetically sealed container 1 or of the electric apparatus 2 chemically reacts on the charged insulating gas 3 to produce a powder 3a of fluorides such as iron fluoride, copper fluoride, or aluminum fluoride. As this powder 3a is of fine particles and very light, they scatter and float in the interior of the hermetically sealed container 1 and fall with the lapse of time. At that time, the quantity of light from the light emitting element 61 transferred to the light receiving element 62 is impeded by the powder 3a floating and falling in the interior of the flange 4, resulting in a decrease in quantity of light received by the light receiving element 62. The decreased quantity of light received by the light receiving element 62 is compared with the quantity of light emitted by the light emitting element 61 by the differential amplifier 8, and an output signal in accordance with a difference between emitted light and received light is delivered to the signal processing device 9. When the signal inputted to the signal processing device 9 is not less than the specified value, a signal is outputted from the signal processing device 9 and the display device 10 is activated by this signal.

Figure 3:
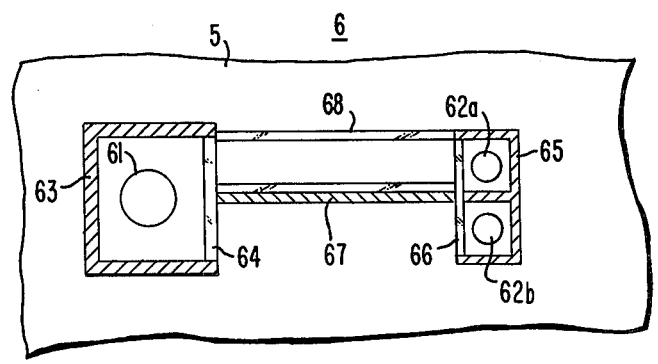
FIG. 3 illustrates another embodiment of the sensing element.

FIG. 3 shows another embodiment of the sensing element 6. The sensing element 6 of FIG. 3 is arranged so that a first and a second light receiving element, 62a and 62b, respectively, are disposed opposite to the light emitting element 61 and both light receiving elements 62a and 62b can receive in equal quantities the light emitted by the light emitting element 61. A protective member 68 is disposed on the optical path through which the first light receiving element 62a receives light, thereby to form a path closed tightly with respect to the insulating gas 3.

Since the sensing element of FIG. 3 is constructed as described above, the first light receiving element 62a receives light from the light emitting element 61 through the tightly closed path with the protective member 68 when the powder 3a produced by a discharge accident falls between the light emitting element 61 and the light receiving elements 62a and 62b. Therefore, the quantity of light received is not affected by the powder 3a and is constant. Conversely, the second light receiving element 62b has light shaded by the falling powder 3a and the quantity of light received by the second light receiving element 62b is decreased. This makes it possible to sense the fault of the electric apparatus 3 with a difference in quantity of received light between the first and second light receiving elements 62a and 62b.

Also, even though the quantity of light from said light emitting element 61 would be changed due to the secular change, malfunction can be prevented because an output deviation between the light emitting element 61 and the light receiving element 62 or between both light receiving elements 62a and 62b is sensed.

As described above, according to the present invention, a change in quantity of light emitted from the light emitting element and received by the light receiving element due to the interposition of a powder shaped product produced by discharge energy, or an abnormality of an electric apparatus can be sensed by a deviation of a quantity of light between the light emitting element and the light receiving element, or a deviation of a quantity of light between a pair of light receiving elements with one of the light receiving elements arranged to receive always a normal quantity of light from the light emitting element. Therefore, centralized supervision becomes possible and a fault section is easily sensed resulting in the effect that an inspection time and a repair time can be shortened.

We claim as our invention:

1. An abnormality sensing device for gas-insulated equipment of the type including electrical apparatus disposed within a hermetically sealed, insulated-gas-containing container, said abnormality sensing device comprising:
   a light emitting element and a light receiving element disposed within said container opposite each other, said light receiving element positioned so as to receive the light emitted by said light emitting element; and
   means for comparing the quantity of light emitted by said light emitting element with the quantity of light received by said light receiving element to sense a change in the quantity of light received by said light receiving element.

2. An abnormality sensing device for gas-insulated equipment of the type including electrical apparatus disposed within a hermetically sealed container with the interior of the container filled with an insulating gas, said abnormality sensing device comprising:
   a light emitting element disposed within said container and emitting light;
   first and second light receiving elements disposed within said container opposite said light emitting element, said first and second light receiving elements being positioned so as to receive equal quantities of light emitted by said light emitting element;
   a protective member disposed within said container preventing the quantity of light emitted by said light emitting element toward said first light receiving element from changing due to changes in said insulating gas; and
   means for comparing the quantities of light received by said first and second light receiving elements to sense a change in quantity of received light.

* * * * *